United States Patent [19]

Sanders

[11] 4,074,009

[45] Feb. 14, 1978

[54] DRIOGRAPHIC MASTER

[75] Inventor: James F. Sanders, Hudson, Wis.

[73] Assignee: Minnesota Mining and Manufacturing Company, St. Paul, Minn.

[21] Appl. No.: 638,454

[22] Filed: Dec. 8, 1975

[51] Int. Cl.[2] .................... B32B 27/06; B32B 27/10; B41N 1/12; G03F 7/20

[52] U.S. Cl. .................... 428/421; 96/1 PC; 96/33; 101/450; 101/453; 101/457; 101/462; 428/422; 428/908

[58] Field of Search .............. 428/908, 914, 422, 421; 101/450, 453, 457, 462; 96/31, 33; 260/884, 33.48

[56] References Cited

U.S. PATENT DOCUMENTS

| | | | |
|---|---|---|---|
| 3,318,852 | 5/1967 | Dixon | 428/422 X |
| 3,368,483 | 2/1968 | Storms | 96/33 |
| 3,511,178 | 5/1970 | Curtin | 96/33 |
| 3,554,836 | 1/1971 | Steindorf | 428/914 |
| 3,574,791 | 4/1971 | Sherman et al. | 260/33.4 |
| 3,779,768 | 12/1973 | Cope | 96/75 |
| 3,790,382 | 2/1974 | Dahlman | 96/33 X |
| 3,859,090 | 1/1975 | Yoerger et al. | 96/33 |
| 3,901,700 | 8/1975 | Yoerger et al. | 96/31 X |
| 3,910,187 | 10/1975 | Cords | 96/33 |
| 3,975,352 | 8/1976 | Yoerger et al. | 101/450 X |
| 3,997,349 | 12/1976 | Sanders | 96/75 |

*Primary Examiner*—J.C. Cannon
*Attorney, Agent, or Firm*—Cruzan Alexander; Donald M. Sell; Gerald F. Chernivec

[57] ABSTRACT

A driographic plate capable of being direct imaged by pen, pencil, typewriter, toner powder, etc. comprising a substrate having a coating thereon, the coating comprising a continuous medium having a solid fluorinated compound containing at least one fluorinated aliphatic radical uniformly dispersed therethrough in a manner such that the coating surface is ink repellent when dry. On direct imaging, the imaged areas will readily accept ink and prints can be made therefrom without necessity of a press dampening system.

6 Claims, No Drawings

DRIOGRAPHIC MASTER

BACKGROUND OF THE INVENTION

This invention relates to waterless planographic printing. More particularly, it relates to novel sheet constructions which are capable of being direct imaged and are suitable for use in planographic printing wherein conventional fountain solutions are not necessary.

Conventional lithographic plates generally require a dampening thereof with an aqueous fountain solution to effectively wet the background plate area, after which ink is rolled over the plate. The oily ink selectively wets the oleophilic image areas but is repelled from the dampened background areas.

Recently, planographic printing plates not requiring dampening have been developed. These plates require only an inking system to be operative and inherently contain ink repellent non-imaged or background areas. This relatively new concept has come to be known by the term driography, and plates useful therein have been termed driographic plates. Such a printing plate is disclosed in U.S. Pat. No. 3,511,178.

Such plates generally operate on the principle that the background surface areas inherently having sufficiently low adhesion to driographic printing inks that ink applied to the plate by an inking roller will not split away or transfer from the roller to the plate. A surface exhibiting such characteristics has come to be termed "abhesive".

Present techniques for imaging such driographic printing plates, i.e providing ink-receptive image areas thereon, generally involve selective removal of the abhesive coating, removal of a light-sensitive layer after imagewise exposure thereof to actinic radiation, etc. To my knowledge, there is not commercially available a direct image driographic plate, i.e. one that can be imaged by conventional marking techniques, such as pen, pencil or office duplicating machines. In U.S. Pat. No. 3,859,090 there is disclosed a driographic printing plate asserted to be directly imageable by toner powder in an electrographic imaging process. However, the abhesive composition therein requires utilization of a fluorinated or polysiloxane oil, i.e. a liquid, to obtain adequate ink repellency in the background or non-image areas of the plate. Such oils will typically cause blinding of the plate, i.e. the image areas will also tend to repel ink during continued press operation by wetting of the total plate surface by the oils due to their inherent mobility; furthermore, the plate therein is not taught to be imageable by marking techniques such as pen, pencil or typewriter.

The only plates presently commercially available for such imaging techniques are conventional lithographic plates, which again require the complex ink-water balance in the printing operation. Besides the complexity in printing operation using conventional lithographic plates, such plates are costly to produce because they of necessity must require wet strength for durability on the press.

It has now been discovered that certain compositions hereinafter defined, which contain fluorinated aliphatic radicals, are capable of providing the requisite abhesiveness to driographic inks when functioning on a printing press, can be directly imaged by conventional direct-image techniques, yet will not blind during press operation.

SUMMARY OF THE INVENTION

In accordance with the invention there is provided an article capable of providing a driographic plate comprising a substrate having coated thereon a continuous medium having a solid fluorinated compound uniformly dispersed therethrough in such a manner that the surface of said coating is oleo ink repellent when dry. The fluorinated compound contains at least one fluorinated aliphatic radical therein.

The coating can be direct imaged, i.e. with a pen, typewriter, toner powder, etc. whereupon it will accept ink in the imaged areas.

The coating can also be coated over light-sensitive systems, e.g. diazos, for conventional imaging and development or over a photoconductive surface for electrophotographic imaging.

DETAILED DESCRIPTION OF THE INVENTION

The ink repellent or abhesive component of the invention herein must be a solid below about 100° F and contain at least one fluorinated aliphatic radical. The radical can be described as a fluorinated, saturated, monovalent, non-aromatic, aliphatic radical of at least three carbon atoms in chain length. The chain may be straight, branched or, if sufficiently large, cyclic, and may be interrupted by divalent oxygen atoms or trivalent nitrogen atoms bonded only to carbon atoms. Preferably, the chain of the fluorinated aliphatic radical does not contain more than one hetero atom, i.e. nitrogen or oxygen, for every two carbon atoms in the chain. A fully fluorinated group is preferred, but hydrogen or chlorine atoms may be present as substituents in the fluorinated aliphatic radical provided that not more than one atom of either is present in the radical for every two carbon atoms, and that the radical must contain at least a terminal perfluoromethyl group. "Terminal" in this connection refers to the position in the chain of the radical which is furthest removed from the backbone chain of a polymer segment or in case of a non-polymeric material, at one end thereof. Preferably, the fluorinated aliphatic radical does not contain more than twenty carbon atoms because such a large radical results in inefficient use of the fluorine content. When the radical is included in a polymer chain, it must, by definition, be pendant, i.e. a side chain or end group. For this reason, fluorinated polymers such as DuPont Viton A (tradename for a copolymer of vinylidene fluoride and perfluoropropene) and polytetrafluoroethylene do not have utility in the invention herein.

Methods for the preparation of polymers containing appropriate pendant fluorinated aliphatic radicals is thoroughly discussed in U.S. Pat. No. 3,574,791, incorporated herein by reference.

Non-polymeric fluorinated aliphatic radical-containing compounds useful herein are low molecular weight compounds which are solids at room temperature and having a polar group at the end opposite the fluorinated radical, e.g. $C_8F_{17}SO_3K$, and $C_8F_{17}CO_2NH_4$. Other examples of non-polymeric materials include the following:

1. $CF_3(CF_2)_7SO_2N(CH_3)CH_2CH_2OH$
2. $CF_3(CF_2)_3SO_2N(CH_3)CH(CH_3)CH_2OH$
3. $CF_3(CF_2)_3SO_2N(CH_2CH_3)CH_2CH_2OH$
4. $CF_3(CF_2)_3SO_2N(CH_3)CH_2CH(CH_3)OH$
5. $CF_3(CF_2)_7SO_2N(CH_3)(CH_2)_5SH$
6. $CF_3(CF_2)_7SO_2N(C_2H_5)CH_2COOH$

7. $CF_3(CF_2)_7SO_2N(C_4H_9)(CH_2)_4OH$
8. $CF_3(CF_2)_7SO_2N(CH_2CH_3)CH_2CH_2NH_2$
9. $[CF_3(CF_2)_7SO_2N(CH_2CH_3)CH_2CH_2]_2NH$
10. $CF_3(CF_2)_7SO_2N(CH_2CH_3)CH_2CH_2N(CH_3)H$
11. $CF_3(CF_2)_7SO_2N(CH_3)CH_2CH_2SH$
12. $C_2F_5O(C_2F_4O)_3CF_2CONHC_2H_4OH$
13. $CF_3(CF_2)_7SO_2N(C_3H_7)CH_2OCH_2CH_2CH_2OH$
14. $CF_3CF(CF_2Cl)(CF_2CF_2)_6CF_2CON(CH_3)CH_2CH_2OH$
15. $CF_3(CF_2)SO_2CH_2CH_2OH$
16. $CF_3(CF_2)_7SO_2N(CH_3)CH_2CH_2SH$
17. $C_7F_{15}CON(C_2H_5)C_2H_4OH$
18. $CF_3(CF_2)_7CH_2CH_2CH_2OH$

It is of course known that such fluoroaliphatic radical-containing materials are increasingly more oil repellent as the weight percentage of the fluorinated aliphatic radical in them is increased. Therefore, the aliphatic radical-containing segment of compositions used herein should contain at least about 10 percent by weight of fluorine which is derived from fluoroaliphatic radicals. It is preferred that such materials contain at least about 30 percent by weight of fluorine derived from fluoroaliphatic radicals so as to optimize the abhesive tendencies of the compound.

The ability of the above-described perfluoroaliphatic radical-containing materials to be imaged by conventional marking techniques is hypothesized to be due to their "orientation" properties combined with their thermosensitive nature. When coated on a substrate, the fluorinated aliphatic radical portions thereof tend to extend or orient themselves toward the air interface, thereby presenting the abhesive characteristics at the coated surface/air interface. When the surface is damaged by a marking instrument, e.g. a pen, pencil, etc., there is no highly mobile abhesive material to "heal" the damage. In the aforementioned U.S. Pat. No. 3,859,090, containing a liquid fluorocarbon or silicone oil, this oil would "heal", at least partially, this damaged area. Similarly, silicone elastomers typically contain highly mobile silicone polymer chains and also some amount of uncrosslinked material within the elastomer network, which would "heal" any damaged area and thus not provide the differential inking capabilities in marked areas.

The surprising capability of the fluorinated materials to bond to fused toner powder from a conventional office copier is believed to be due to the thermo-sensitive nature of the compounds, i.e. the ability thereof to heat soften. During the fusing operation, the fluorinated materials can partially surround the toner particles, and yet upon cooling, the fluorinated material will typically regain its more rigid state. It is also suspected that when conventional toner powder is being fused by heat and the fluorinated material adjacent to the toner powder is in a heat softened state, there is less tendency to present the low surface energy abhesive perfluoroaliphatic radicals to the toner melt than to the air interface. This tends to increase the ability of the toner melt to bond to the fluorinated material.

The fluoroaliphatic radical-containing compounds having utility herein tend to be waxy or brittle, and thus do not have optimum physical properties necessary to form a durable film on a substrate. Furthermore, compounds containing high percentages of fluorinated aliphatic radicals tend to be poorly soluble in most common solvents, and in order to obtain adequate solubility, the molecular weight of the compounds must be kept low. This feature contributes to poor film strength and also results in very low solution viscosities thereby making it impossible to obtain good holdout on paper or other porous substrates. Durability is of course necessary in a printing operation due to the tack of the ink, abrasion of the inking rollers, offset blanket, paper, etc.

Therefore, it is obvious that a binder compound is desirable to optimize the film strength. Conventional binders in coating solutions are typically solution polymers. Examples of such materials are acrylics, epoxies, etc. In order to provide an abhesive surface, it is necessary that the fluorinated material come to the surface to form the thermodynamically lowest energy interface with air, i.e. there must be some layering or stratification of the coating as it dries. When this occurs, the coating surface exhibits the aforementioned difficulties of the fluorinated material itself with the exception that inclusion of the binder may provide better holdout on porous substrates.

A novel and surprising solution to this problem is to employ a medium which is substantially insoluble in the coating application solvent, i.e. the medium is a discrete phase in the coating mixture. Upon application to a substrate and solvent evaporation, the particles of the medium must have sufficient capabilities of fusing to form a continuous durable film. In this instance, the fluoroaliphatic radical-containing compound is apparently trapped in the voids between interlocking particles and is thus uniformly dispersed therein. The coating exhibits the necessary abhesive properties while the binder contributes to the coating durability and imageability. In other words, upon marking the film, the abhesive fluorinated material is disrupted, thereby exposing the high surface energy binder particles which are easily wettable by the printing ink.

The binder medium when in particulate form must contain particles of small size; generally those less than 50 microns in size are sufficient. Furthermore, the particles may swell in, but must not be soluble in, the coating application solvent and the particles must be sufficiently fusible, either upon drying of the coating or by subsequent treatment such as heating, to provide a continuous film.

Examples of particulate resins include polyvinylchloride resins such as B. F. Goodrich Geon 128, which fuses upon drying of the coating and polyethylene-vinyl acetate copolymers such as USI Chemical Company's Microthene FE532 which is capable of fusing upon application of heat thereto subsequent to drying of the coating.

Substrates for the plates of the invention typically include porous materials, e.g. paper, films, e.g. polyester and metallic foils.

Solvents utilized to prepare solutions of the fluoroaliphatic radical-containing compound typically include oxygenated solvents, such as alcohols, ketones or esters, although solvent selection generally depends on the polymer structure. For example, water soluble polymers can be prepared, in which case water can be a suitable solvent.

Concentration of total solids in the coating solution can typically range up to 50 percent by weight for ease of coating and control of dry coating weights. Coating weights of up to about 1.0 gram per square foot are satisfactory. Lower coating weights are acceptable providing a uniform film can be obtained, and coating weights greater than about 1.0 gram per square foot, while not detrimental, tend to be wasteful.

The driographic plates of this invention may be imaged by conventional marking techniques presently utilized for direct image lithographic plates. The fluorinated composition can also be overcoated over a light-sensitive system, e.g. diazo, for conventional exposure and aqueous development. Furthermore, the fluorinated composition may be coated over a photoconductive receiver, e.g. a zinc oxide coated substrate, for electrophotographic imaging.

Another technique found useful for imaging the plate involves the elastomeric transfer principle enunciated in U.S. Pat. No. 3,554,836. Utilizing the toner powder transfer techniques disclosed therein, one embodiment of my invention may be utilized as both the ultimate printing plate and the photoconductive receiver for the toner powder during imaging. This can be undertaken by utilizing a substrate, e.g. paper, polyester film, metal, etc. having a coating on one surface thereof which provides the adhesive properties necessary herein, and having on the opposite surface of the substrate a coating of a photoconductor which is an electrophotographic material such as zinc oxide, titanium dioxide or selenium conventionally applied thereto. In this instance, the photoconductor surface of the substrate is imaged and developed with copier toner powder in conventional fashion. A silicone elastomer surface is then contacted with the toner powder image-bearing photoconductor surface, in accordance with the teachings of aforementioned U.S. Pat. No. 3,554,836. The toner powder is transferred to and retained by the silicone surface. The toner-bearing silicone surface is then contacted to the fluoroaliphatic coated side of the driographic plate surface. Heat is applied at the area of contact to attain the fusing temperature required for the toning powder whereupon the silicone elastomer surface and the driographic plate surface are separated. The toner powder is transferred to the fluorinated plate surface, and has been substantially released completely by the silicone elastomer surface.

The invention will now be further illustrated by the use of the following specific non-limiting examples, wherein all parts are by weight unless otherwise specified.

EXAMPLE 1

A fluoroaliphatic radical-containing polymer was prepared by charging to a reaction vessel 70 parts of $C_8F_{17}SO_2N(C_2H_5)C_2H_4O_2CCH{=}CH_2$ and 30 parts of $HOC_2H_4O_2CCH{=}CH_2$, and tetrahydrofuran solvent was added to attain a 50 percent solids solution. A conventional free radical initiator was added to the solution. The vessel was evacuated and purged with nitrogen for two hours. The vessel was then heated to 50° C in the nitrogen atmosphere for 24 hours. A solution polymer of the above components was obtained.

To 15 parts of the solution polymer were added 70 parts of methyl ethyl ketone.

A binder slurry was prepared by high shear mixing 30 parts of Geon 128 (tradename for a polyvinyl chloride dispersion resin available from the B. F. Goodrich Co. ) in 70 parts of toluene which effectively wet the particles to form a slurry.

A coating application solution was prepared by stirring the polymer solution with the slurry for three hours during which the polyvinyl chloride particles swelled in the presence of the polymer solution solvents but were substantially undissolved by same.

The coating solution was knife coated onto paper and corona primed 3 mil polyester film and dried to provide a coating weight of 1.0 gram per square foot.

The coatings were easily imaged by pencil, ballpoint, pen, typewriter, IBM Copier II (tradename for a toner powder imaging copier machine commercially available from the IBM Corp.) and a Xerox 3100 (tradename for a toner powder imaging copier machine commercially available from the Xerox Corp.).

After imaging, the plates were mounted on a conventional offset printing press with the dampening system removed and ink was supplied to the ink train. More than 700 quality copies were produced on the press.

To illustrate the effectiveness of the dispersion resin binder in the coating, a coating solution was prepared as above but excluding the polyvinyl chloride resin therefrom and coated on 3 mil corona primed polyester. After imaging with toner powder, the plate was placed on one side of the plate cylinder of the offset press, and a similar plate prepared as above with the polyvinyl chloride resin was placed on the other side of the plate cylinder.

Although both plates produced prints, the loss of fused copier toner into the printing ink was evident on the binderless plate at from 10 to 100 copies, while the plate containing the binder evidenced no toner "picking" by the printing ink over a 700 copy press run.

At about 150 copies, the binderless plate coating was visibly abraded, and printing ink was depositing on the exposed polyester film. No abrasion loss was exhibited on the plate containing the binder.

Most surprisingly, the toning, i.e. the casual deposition of ink in the non-image or background areas of the plate, was equal for the two plates at the beginning of the run, yet the toning at the end of the run was greater in the binderless plate.

EXAMPLE 2

A water-soluble, fluorinated polymer was prepared by free-radical polymerization in butyl cellosolve as per the conditions of Example 1, the polymer containing 50 percent by weight of $C_8F_{17}SO_2N(C_2H_5)O_2CC(CH_3){=}CH_2$ and 50 percent by weight of Carbowax 400/diacrylate. Carbowax 400 is a polyethylene glycol available from the Union Carbide Co., and the diacrylate was prepared by well known esterification techniques utilizing acrylic acid. The butyl cellosolve was stripped from the polymer and the polymer was mixed with water to obtain a 10 percent by weight solids solution thereof.

By conventional emulsion polymerization techniques, a terpolymer aqueous emulsion was prepared consisting of 35 percent by weight isooctylacrylate, 50 percent by weight acrylonitrile, and 15 percent by weight of acrylic acid. The emulsion was diluted to 10 percent solids in water.

Equal parts of the solution and emulsion were mixed and knife coated onto a corona primed polyester sheet and dried to provide a dry coating weight of 1.0 gram per square foot.

A durable direct imageable film was obtained which after imaging functioned similar to Example 1 on the printing press.

EXAMPLE 3

Sixty-five grams of a powdered polyethylene-vinyl acetate copolymer commercially available from the USI Chemicals Co. as Microthene FE532, was added to 32.5 grams of the fluorinated polymer of Example 1, 32.5 grams of tetrahydrofuran, and 32.5 grams of methyl ethyl ketone. The resulting slurry was thoroughly mixed for two hours, knife coated onto 3 mil corona primed polyester film, and dried to provide a coating weight of about 1.0 gram per square foot. The coated sheet was heated by passing it through a 325° F nip roll at 5 inches per second. The heating caused the dispersion copolymer to fuse producing a durable film.

Upon direct imaging and placing on a press as per Example 1, press copies were produced.

What is claimed is:

1. An article capable of providing a driographic printing plate which can be direct imaged, comprising a substrate having a coating on at least one surface thereof, said coating comprising a fused particulate binder compound characterized by high surface energy and easy wettability when exposed to printing ink having a solid, at less than 100° F, heat-softenable fluorinated compound uniformly dispersed therethrough in a manner such that the surface of said coating is oleo ink repellent when dry; said fluorinated compound containing at least one fluorinated aliphatic radical therein having at least one terminal perfluoromethyl group, said coating containing no material serving to flow at ordinary image-marking temperatures to heal image-marked areas therein.

2. The article of claim 1 wherein said binder compound comprises polyvinyl chloride resin.

3. The article of claim 1 wherein said radical is monovalent, saturated, and contains at least three carbon atoms.

4. The article of claim 1 wherein said fluorinated compound is a polymer and said radical is a pendant group within said polymer.

5. The article of claim 1 wherein said substrate is paper.

6. The article of claim 1 wherein said substrate is polyester.

* * * * *